United States Patent
Parathithasan et al.

(10) Patent No.: US 10,504,762 B2
(45) Date of Patent: Dec. 10, 2019

(54) BRIDGING FRONT OPENING UNIFIED POD (FOUP)

(71) Applicant: APPLIED MATERIALS, INC., Santa Clara, CA (US)

(72) Inventors: Karrthik Parathithasan, Singapore (SG); Fang Jie Lim, Singapore (SG); Sriskantharajah Thirunavukarasu, Singapore (SG); Eng Sheng Peh, Singapore (SG)

(73) Assignee: APPLIED MATERIALS, INC., Santa Clara, CA (US)

( * ) Notice: Subject to any disclaimer, the term of this patent is extended or adjusted under 35 U.S.C. 154(b) by 55 days.

(21) Appl. No.: 15/956,481

(22) Filed: Apr. 18, 2018

(65) Prior Publication Data

US 2019/0244845 A1     Aug. 8, 2019

Related U.S. Application Data

(60) Provisional application No. 62/626,762, filed on Feb. 6, 2018.

(51) Int. Cl.
*B65D 85/48* (2006.01)
*H01L 21/673* (2006.01)
*H01L 21/67* (2006.01)

(52) U.S. Cl.
CPC .. *H01L 21/67376* (2013.01); *H01L 21/67126* (2013.01)

(58) Field of Classification Search
CPC .............. B65D 85/48; H01L 21/67126; H01L 21/67359; H01L 21/67369; H01L 21/67376

(Continued)

(56) References Cited

U.S. PATENT DOCUMENTS 5,577,621 A    11/1996  Yi
6,781,205 B1 *  8/2004  Levit ................. H01L 21/67253
                                                      206/709

(Continued)

FOREIGN PATENT DOCUMENTS

JP        2012104570 A     5/2012

OTHER PUBLICATIONS

KIPO International Search Report for PCT/US2019/016468, dated May 23, 2019.

*Primary Examiner* — Luan K Bui
(74) *Attorney, Agent, or Firm* — Moser Taboada; Alan Taboada

(57) ABSTRACT

A bridging front opening unified pod (FOUP) is provided herein. In some embodiments, the bridging FOUP includes a bottom floor, side walls, a ceiling and a back wall that forms an enclosure volume having a front opening, a plurality of supports coupled to the side walls and extending into the enclosure volume, wherein the plurality of supports are configured to support a substrate carrier, a base plate assembly comprising a base plate coupled to the bottom floor, a pair of L-brackets coupled to the base plate, wherein each L-brackets includes a short lift pin, a long lift pin coupled to the base plate, wherein the height of the short lift pins and the long lift pin is selected such that the substrate is kept level when disposed thereon, and a docking support disposed proximate the base plate assembly and configured to support a substrate carrier.

20 Claims, 4 Drawing Sheets

(58) Field of Classification Search
USPC ............... 206/454, 710, 711, 832; 211/41.18
See application file for complete search history.

(56) References Cited

U.S. PATENT DOCUMENTS

| | | |
|---|---|---|
| 6,955,197 B2 | 10/2005 | Elliot et al. |
| 7,409,263 B2 | 8/2008 | Eilliot et al. |
| 7,585,686 B2 | 9/2009 | Verhaverbeke et al. |
| 9,412,619 B2 | 8/2016 | Kumar et al. |
| 2002/0187024 A1 | 12/2002 | Nulman |
| 2008/0216077 A1 | 9/2008 | Emani et al. |
| 2009/0090547 A1 | 4/2009 | Kariya et al. |
| 2010/0065467 A1* | 3/2010 | Murata ............. H01L 21/67369 206/710 |
| 2011/0100937 A1 | 5/2011 | Mohamed |
| 2013/0068656 A1* | 3/2013 | Sheng ............... H01L 21/67379 206/710 |
| 2013/0146503 A1* | 6/2013 | Wang ................ H01L 21/67369 206/710 |
| 2013/0341239 A1* | 12/2013 | Inoue ....................... H01L 23/02 206/711 |
| 2014/0034610 A1 | 2/2014 | Fazio et al. |
| 2014/0197068 A1* | 7/2014 | Cho .................. H01L 21/67369 206/711 |
| 2015/0294887 A1* | 10/2015 | Burns ............... H01L 21/67393 206/711 |
| 2015/0311098 A1* | 10/2015 | Cho .................. H01L 21/67383 206/711 |
| 2015/0332950 A1 | 11/2015 | Mazzocco et al. |
| 2017/0186638 A1 | 6/2017 | Chen et al. |

\* cited by examiner

BRIDGING FRONT OPENING UNIFIED POD (FOUP)

CROSS-REFERENCE TO RELATED APPLICATIONS

This application claims benefit of U.S. provisional patent application Ser. No. 62/626,762, filed Feb. 6, 2018, which is herein incorporated by reference in its entirety.

FIELD

Embodiments of the present disclosure generally relate to bridging front opening unified pods (FOUPs) used to securely and safely hold and store substrates in a controlled environment and to allow the substrates to be transferred between processing tools for processing or measurement.

BACKGROUND

Silicon substrates are inherently brittle, sensitive and have to be handled with care. During and before processes they have to be stored in a manner whereby contamination does not affect the quality of the substrates. This is mainly done by utilizing FOUPs (Front Opening Unified Pods) and FOSBs (Front Opening Shipping Box). FOUPs are specialized plastic enclosures designed to hold substrates securely and safely in a controlled environment, and to allow the substrates to be transferred between machines for processing or measurement.

FOUPs inherently have the capabilities to serve a multitude of functions such as substrate storage, protection from ambient contamination, light sensitivity and provides users with an automated option. Since the semiconductor industry has shifted their focal point from 200 mm substrates to 300 mm substrates to increase chip production from a single substrate, majority of FOUP manufacturers have tailored their resources to the development of FOUPs and FOSBs solely meant for serving 300 mm substrates which is in line with a vast majority of process and metrology equipment existing in the industry.

Despite a shift in focus from 200 mm to 300 mm substrates, chipmakers phasing have not discontinued usage of 200 mm substrates. In order to further boost their production capabilities, chipmakers should be able to run multiple substrate sizes interchangeably at their convenience without costly and time consuming hardware changes thus affecting their overall throughput. As mentioned earlier, majority of the tools available are specifically meant for 300 mm substrates.

Thus, the inventors have provided an innovative solution to aid in the bridging process between a larger substrate carrier (e.g., 300 mm or 450 mm) and a smaller substrate (e.g., a 200 mm or 300 mm) in an automated manner.

SUMMARY

A bridging front opening unified pod (FOUP) is provided herein. In some embodiments, the bridging FOUP includes a bottom floor, side walls, a ceiling and a back wall that forms an enclosure volume having a front opening, a plurality of supports coupled to the side walls and extending into the enclosure volume, wherein the plurality of supports are configured to support a substrate carrier, a base plate assembly comprising a base plate coupled to the bottom floor, a pair of L-brackets coupled to the base plate, wherein each L-brackets includes a short lift pin, a long lift pin coupled to the base plate, wherein the height of the short lift pins and the long lift pin is selected such that the substrate is kept level when disposed thereon, and a docking support disposed proximate the base plate assembly and configured to support a substrate carrier.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of the scope of the disclosure, for the disclosure may admit to other equally effective embodiments.

Figure 1A:
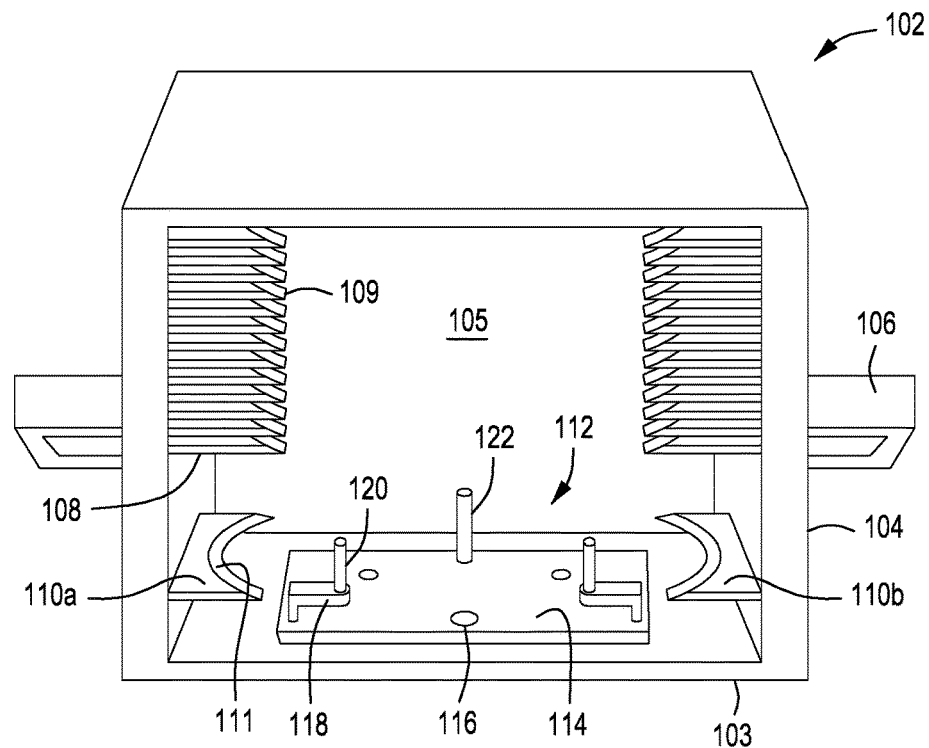
FIG. 1A depicts a perspective view of a bridging FOUP in accordance with some embodiments of the present disclosure.

To facilitate understanding, identical reference numerals have been used, where possible, to designate identical elements that are common to the figures. The figures are not drawn to scale and may be simplified for clarity. The elements and features of one embodiment may be beneficially incorporated in other embodiments without further recitation.

DETAILED DESCRIPTION

Embodiments of the present disclosure help facilitate the processing of multiple substrate sizes on a single tool. More specifically, embodiments of the present disclosure advantageously aid in the bridging process between a larger substrate carrier (e.g., 300 mm or 450 mm) and a smaller substrate carrier (e.g., a 200 mm or 300 mm) in an automated manner. The inventive bridging FOUPs described herein are compatible with tools that are meant for larger substrates (e.g., 300 mm or 450 mm substrates). For instance the APPLIED CHARGER®, a tool comprising of several chambers for different process functions such as metal deposition, per-cleaning and more, will be able to accommodate the bridging FOUP easily without having any external changes on the Factory Interface (FI) load ports. With the inherent accuracy of the robot blades within the FI, the docking of the carrier and 200 mm substrate (or 200 mm or 300 mm substrate used in a 450 mm FOUP) will be done with minimal to zero error once the necessary calibrations are performed as compared to having do so manually. Further-more, Embodiments of the present disclosure advantageously eliminate human contact with the substrates, hence reducing contamination possibilities drastically. Thus, the inventive FOUPs described herein advantageously increase the overall throughput thus increasing efficiency.

Embodiments consistent with the present disclosure described herein are discussed in terms of using a 200 mm substrate in a FOUP originally designed to hold 300 mm substrates. However, embodiments consistent with the present disclosure can also be applied to the use of 200 mm and/or 300 mm substrates in a 450 mm FOUP and associated 450 mm substrate processing tool.

Figure 1B:
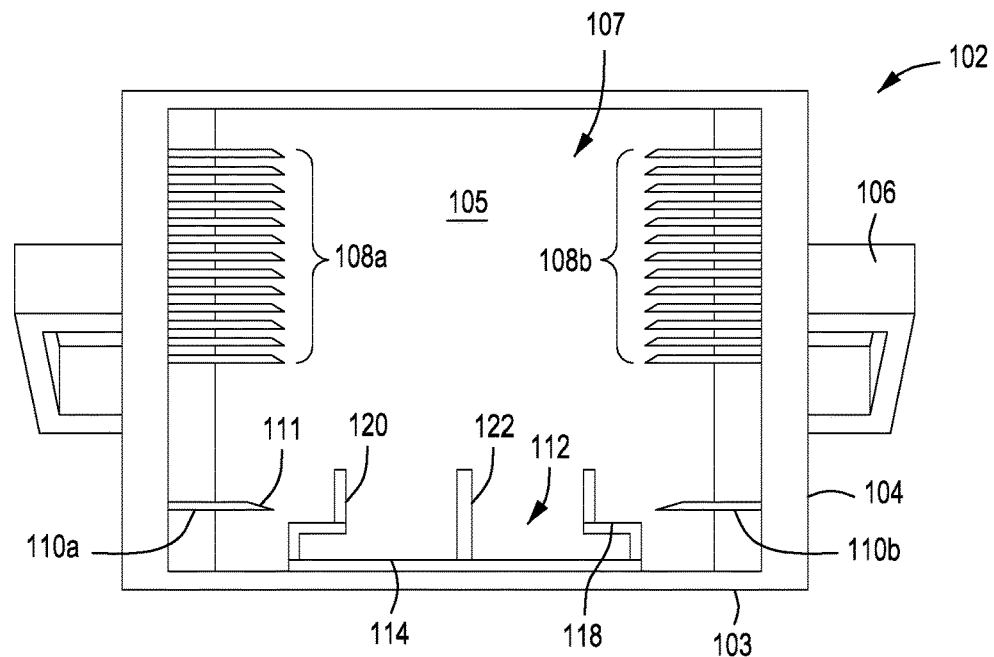
FIG. 1B depicts a front view of a bridging FOUP in accordance with some embodiments of the present disclosure.
Figure 2A:
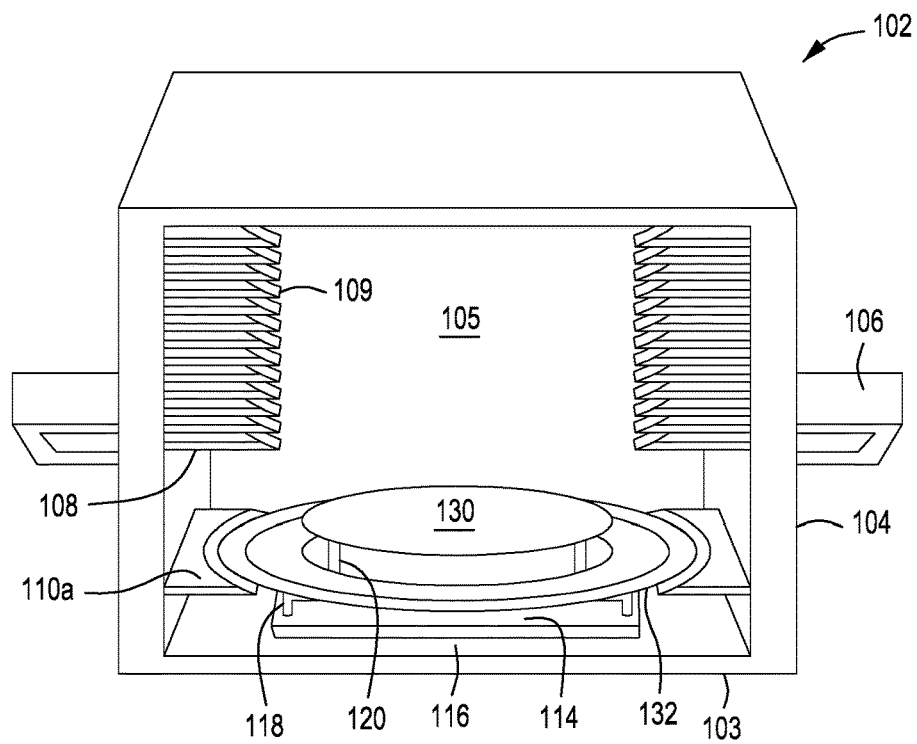
FIG. 2A depicts a perspective view of a bridging FOUP including a substrate and substrate carrier disposed on the base plate assembly in accordance with some embodiments of the present disclosure.
Figure 2B:
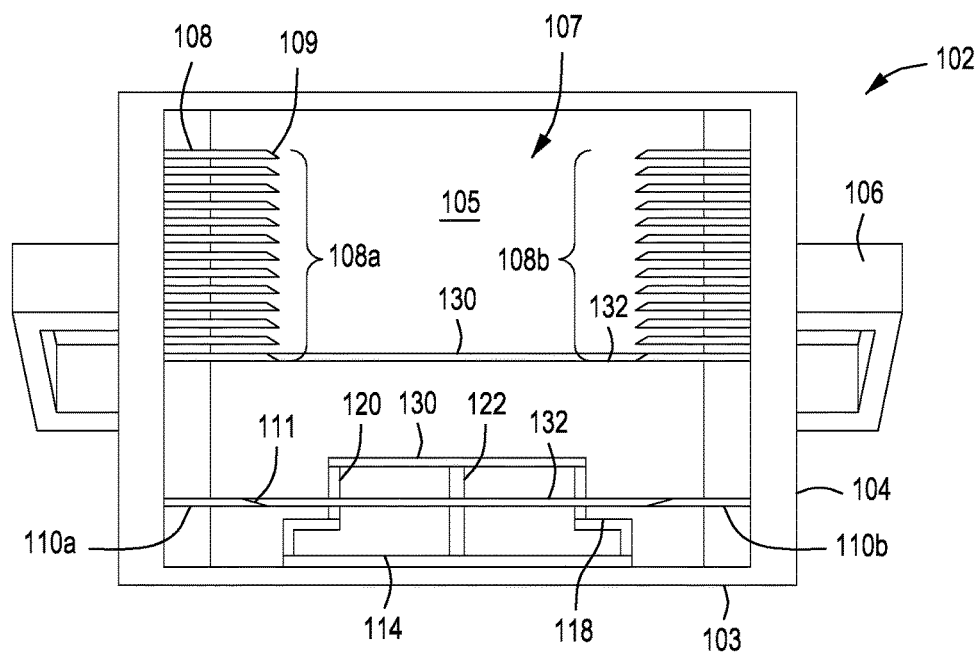
FIG. 2B depicts a front view of a bridging FOUP including a substrate and substrate carrier disposed on the base plate assembly in accordance with some embodiments of the present disclosure.
Figure 3:
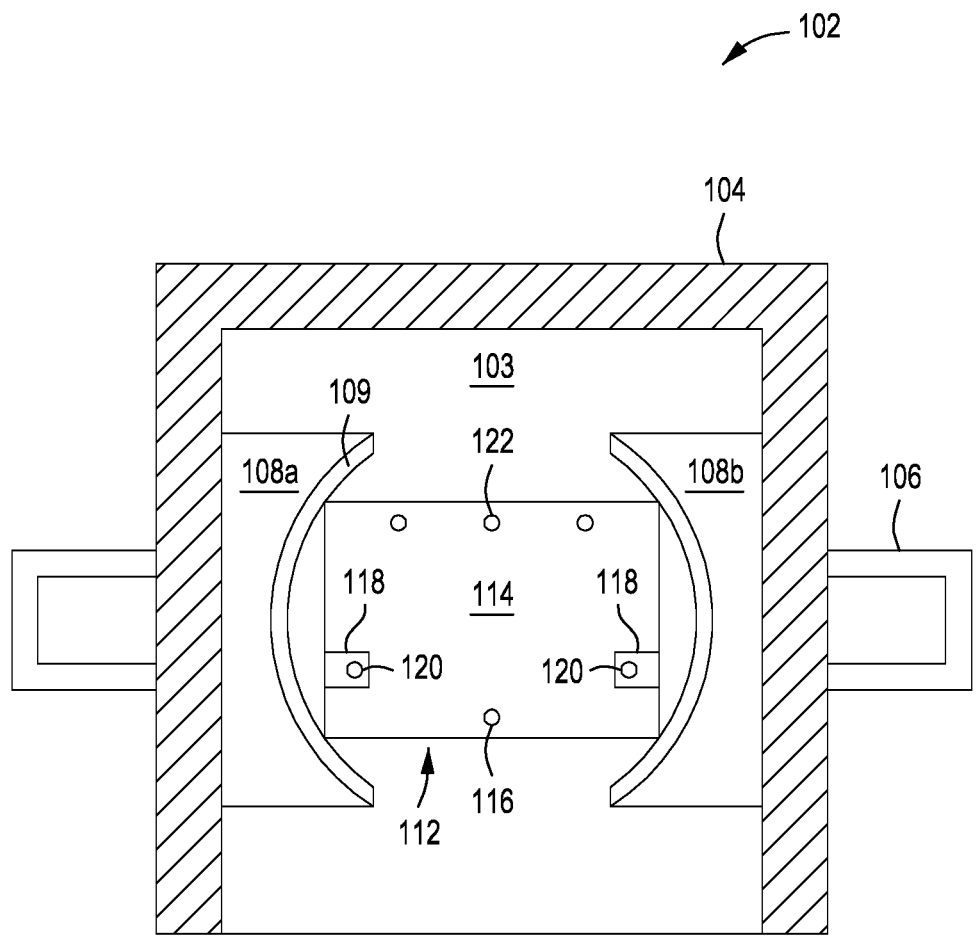
FIG. 3 depicts a top view of a bridging FOUP in accordance with some embodiments of the present disclosure.

FIGS. 1A and 1B depict a perspective view and a front view of a bridging FOUP in accordance with some embodiments of the present disclosure. Similarly, FIGS. 2A and 2B depict the same perspective and front view of a bridging FOUP including a substrate and substrate carrier disposed on the base plate assembly. FIG. 3 depicts a top cross-sectional view of the FOUP without the substrate carrier or substrate disposed therein. Embodiments of the bridging FOUP 102 are comprised of several parts which are described with respect to FIGS. 1A-3 together below.

As shown in FIGS. 1A-3, the FOUP 102 includes a bottom floor 103, sidewalls 104, and a back wall, which forms an enclosure volume 105 having a front opening 107. The FOUP 102 may be fabricated from Aluminum, Aluminum alloys, steel, Polyether ether ketone (PEEK), composite materials, and the like. In some embodiments, the FOUP 102 includes a pair of handles 106 coupled to the sidewalls 104. In other embodiments, the FOUP 102 may not include any handles, or one or more handles 106 may be coupled on the top of the FOUP 102.

The FOUP 102 includes a plurality of slots 108 configured to hold either a substrate or a substrate carrier. For example, each slot of a 300 mm FOUP can hold a 300 mm substrate, or a 300 mm substrate carrier (e.g., substrate carrier 132) that can hold a 200 mm substrate (e.g., substrate 130). Similarly, each slot of a 450 mm FOUP can hold a 450 mm substrate, or a 200 mm or 300 mm substrate carrier (e.g., substrate carrier 132) that can hold a 200 mm or 300 mm substrate (e.g., substrate 130). Each slot 108 is comprised of a pair of supports 108a, 108b—left support 108a, and right support 108b. Each support 108a, 108b is attached to the sidewall 104 of the FOUP 102. In some embodiments, the supports 108a, 108b securely fit into grooves machined into sidewalls 104. In other embodiments, the supports 108a, 108b may also be coupled/affixed to sidewalls 104 through fasteners, welding, glues, etc. The supports 108a, 108b may be fabricated from Aluminum, Aluminum alloys, steel, Polyether ether ketone (PEEK), composite materials, and the like. In some embodiments, the supports 108a, 108b are removable and can be individually replaced/recycled as necessary.

In some embodiments, the substrate carrier facing edge of each support 108a, 108b may be arc shaped and/or may include a support ledge 109 that supports the substrate carrier 132 along a portion of the outer diameter of the substrate carrier 132. In some embodiments, the FOUP 102 can include about 10-15 slots 108 that are equidistantly spaced from one another. The number of slots 108 and vertical distance between slots is selected to accommodate the thicker substrate carrier 132 and such that there is ample space for the base plate assembly 112 and clearance for the robot end effector during movement. In some embodiments, vertical distance between slots is about 12 mm to about 15 mm. In some embodiments, the FOUP 102 includes 15 slots that are vertically spaced about 12 mm from each other.

The FOUP 102 further includes a docking supports 110a, 110b. The docking supports 110a, 110b are the same as supports 108a, 108b but are disposed proximate the base plate assembly 112 and used in docking the substrate 130 to the substrate carrier 132. The supports docking supports 110a, 110b also include a support ledge 111 that supports the substrate carrier 132 along a portion of the outer diameter of the substrate carrier 132. The docking supports 110a, 110b may be coupled to the sidewalls 104 as described above with respect to supports 108a, 108b. In addition, in some embodiments, the docking supports 110a, 110b are removable and can be individually replaced/recycled as necessary.

The FOUP 102 includes a base plate assembly 112 that is used in docking the substrate 130 to the substrate carrier 132. The base plate assembly 112 includes a base plate 114 secured to the bottom floor 103 of the FOUP 102. In some embodiments, the base plate 114 may be made from Aluminum, Aluminum alloys, steel, Polyether ether ketone (PEEK), composite materials, and the like. In some embodiments, the base plate 114 may be secured to the bottom floor 103 via fasteners 116, which allows the base plate 114 to be removed/recycled as necessary. Other fastening techniques may also be used such as gluing, welding, and the like.

A pair of L-brackets 118 are attached to the base plate 114. In some embodiments, the L-brackets 118 are removably coupled to the base plate 114. Each L-bracket 118 includes a short lift pin 120 coupled to an upper surface of the L-bracket 118. In some embodiments, the short lift pins 120 are removably coupled to the L-bracket 118. The base plate assembly 112 further includes a long lift pin 122 attached to the base plate 114. Similarly, in some embodiments, the long lift pin 122 may be removably coupled to the base plate 114. In some embodiments, the lift pins 120, 122 have a 180 mm support circumference and are 120° apart from each other, thus a 200 mm substrate can easily rest on the lift pins 120, 122. The unique design and placement of the L-brackets 118, short lift pins 120 and long lift pins 122, allows the robot blade end effector to place substrates 130 and substrate carriers 132 with sufficient clearance. The height of the short lift pins 120 and the long lift pin 122 is selected such that the substrate 130 is kept level when disposed thereon. In some embodiments, each of the short lift pins 120 and the long lift pin 122 includes a circular protrusion on the top such that each lift-pin 120, 122 provides support with point contact with the backside of the substrate 130.

In some embodiments, the L-brackets 118, short lift pins 120, and long lift pins 122 are made of PEEK material for its high strength, durability and negligible weight. In other embodiments, the L-brackets 118, short lift pins 120, and long lift pins 122 may be made of aluminum or other materials that provide similar material properties as PEEK. In some embodiments, the L-brackets 118 and lift-pins 120, 122 will be assembled prior to securing at the base plate assembly 112 to the bottom floor 103 of the bridging FOUP 102.

The FOUP 102 described above is configured to be used with a substrate carrier 132 that is configured to support a substrate 130. For example, as described in the non-limiting example above, a 300 mm substrate carrier 132 may be used to hold a 200 mm substrate 130, although those skilled in the art would recognize that other size substrates/carries may be used. In some embodiments, the substrate carrier 132 may be a substrate carrier assembly including a carrier and a shadow ring. The main purpose of the carrier would be to mimic the size of a 300 mm substrate so it can be used in the substrate processing tool. An additional feature would be the pocket that would allow the 200 mm substrate to rest on said carrier before being transported for processing. The shadow ring can be utilized to prevent contamination during processing, which essentially acts as a barrier to protect the substrate carrier 132 from any form of deposition.

The substrate carrier 132 includes three lift pin holes that align with the short lift pins 120 and long lift pins 122. As shown in FIG. 2B, the short lift pins 120 and long lift pins 122 pass through lift pin holes in substrate carrier 132 when the substrate carrier 132 is docked on the docking supports 110a, 110b.

Figure 4:
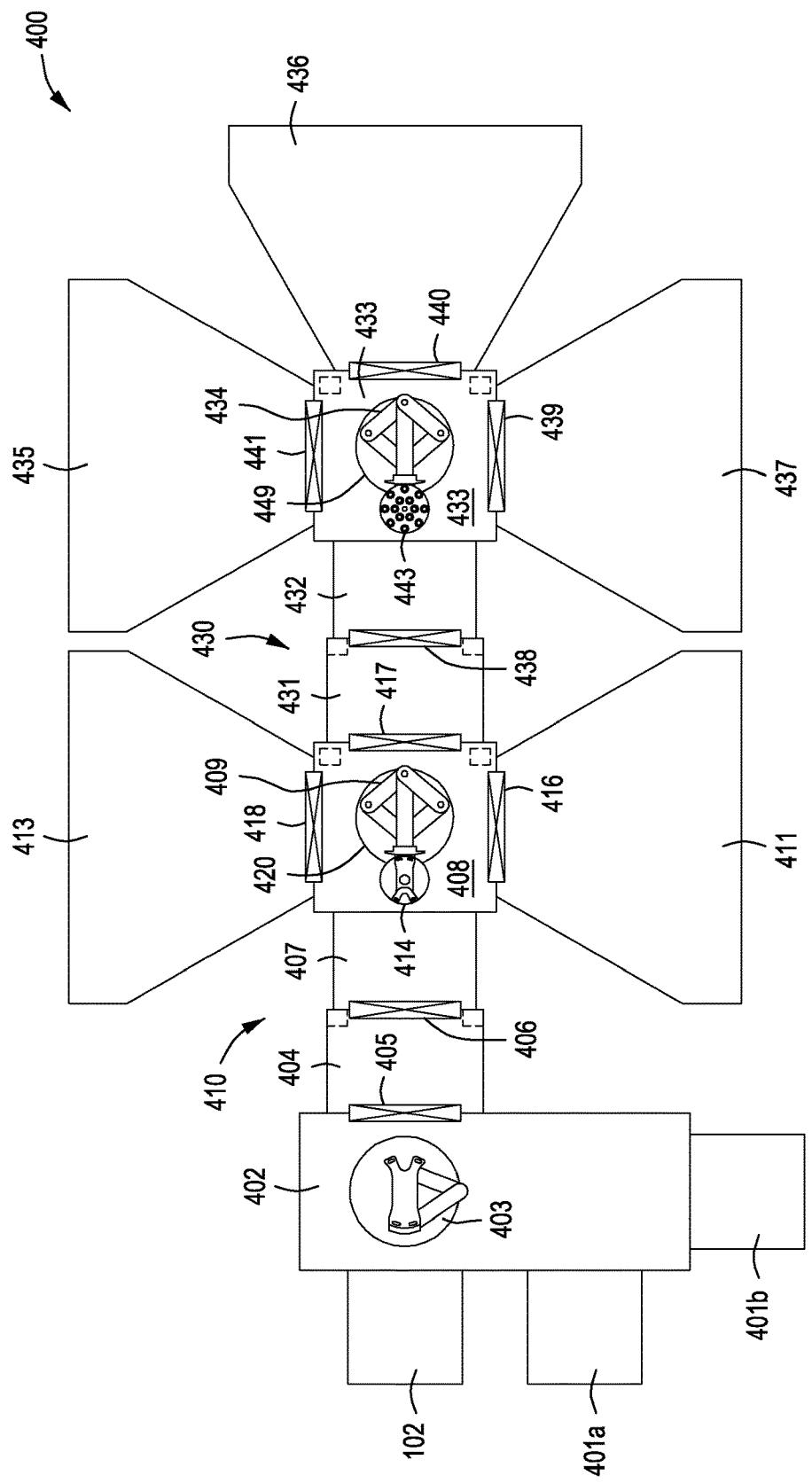
FIG. 4 is a plan view of a multi-chamber cluster tool suitable to perform methods for processing a substrate in accordance with some embodiments of the present disclosure.

FIG. 4 schematically illustrates a plan view of a non-limiting example of an integrated multi-chamber substrate processing tool 400 having an apparatus for handling substrates of different sizes in accordance with the present disclosure. Examples of the tool 400 include the APPLIED CHARGER®, CENTURA®, ENDURA®, and PRODUCER® line of integrated substrate processing tools, available from Applied Materials, Inc., of Santa Clara, Calif. The multi-chamber substrate processing tool 400 comprises multiple processing chambers coupled to a mainframe comprising two transfer chambers 408 and 433.

The multi-chamber substrate processing tool 400 comprises a front-end environment factory interface (FI) 402 in selective communication with a load lock chamber 404. The bridging FOUP 102 described above is configured to hold 300 mm substrate carriers and 200 mm substrates and is coupled to the FI load port 402. Accompanying the bridging FOUP 102 will be two regular FOUPs—a first regular FOUP 401a containing 300 mm substrate carriers 132 and a second regular FOUP 401b containing 200 mm substrates 130. A factory interface robot 403 is disposed in the FI 402. The factory interface robot 403 is configured to transfer substrates to/from the two 2 regular FOUPs 401a and 401b to the bridging FOUP 102, and then from the bridging FOUP 102 to/from the load lock chamber 404. Once all FOUPs 102, 401a, and 401b have been placed onto the load ports, the robot 403 will then take a substrate carrier 132 from FOUP 401a, align it and place it on the docking supports 110a, 110b in the bridging FOUP 102. The lift pins 120, 122 on the base plate assembly 112 fit through the three lift pin holes on the substrate carrier 132. Upon completion the robot blade of robot 403 will then take a 200 mm substrate 130 from FOUP 401b and repeat the same process before placing it on the three lift pins 120, 122. After the substrate 130 and substrate carrier 132 are docked on docking supports 110a, 110b and base plate assembly 112, robot 403 will pick both the carrier and 200 mm substrate before storing it in the slots 108 above.

The load lock chamber 404 provides a vacuum interface between the FI 402 and a first transfer chamber assembly 410. An internal region of the first transfer chamber assembly 410 is typically maintained at a vacuum condition and provides an intermediate region in which to shuttle substrates, or substrate carriers 132 holding substrates 130, from one chamber to another and/or to a load lock chamber.

In some embodiments, the first transfer chamber assembly 410 is divided into two parts. In some embodiments of the present disclosure, the first transfer chamber assembly 410 comprises a transfer chamber 408 and a vacuum extension chamber 407. The transfer chamber 408 and the vacuum extension chamber 407 are coupled together and in fluid communication with one another. An inner volume of the first transfer chamber assembly 410 is typically maintained at low pressure or vacuum condition during process. The load lock chamber 404 may be connected to the FI 402 and the vacuum extension chamber 407 via slit valves 405 and 406 respectively.

In some embodiments, the transfer chamber 408 may be a polygonal structure having a plurality of sidewalls, a bottom and a lid. The plurality of sidewalls may have openings formed therethrough and are configured to connect with processing chambers, vacuum extension and/or pass through chambers. The transfer chamber 408 shown in FIG. 4 has a square or rectangular shape and is coupled to processing chambers 411, 413, a pass through chamber 431 and the vacuum extension chamber 407. The transfer chamber 408 may be in selective communication with the processing chambers 411, 413, and the pass through chamber 431 via slit valves 416, 418, and 417 respectively.

In some embodiments, a central robot 409 may be mounted in the transfer chamber 408 at a robot port formed on the bottom of the transfer chamber 408. The central robot 409 is disposed in an internal volume 420 of the transfer chamber 408 and is configured to shuttle substrates or substrate carriers 132 holding substrates 130 among the processing chambers 411, 413, the pass through chamber 431, and the load lock chamber 404. In some embodiments, the central robot 409 may include two blades for holding substrates, or substrate carriers 132 holding substrates 130, each blade mounted on an independently controllable robot arm mounted on the same robot base. In another embodiment, the central robot 409 may have the capacity for vertically moving the blades.

The vacuum extension chamber 407 is configured to provide an interface to a vacuum system to the first transfer chamber assembly 410. In some embodiments, the vacuum extension chamber 407 comprises a bottom, a lid and sidewalls. A pressure modification port may be formed on the bottom of the vacuum extension chamber 407 and is configured to adapt to a vacuuming pump system. Openings are formed on the sidewalls so that the vacuum extension chamber 407 is in fluid communication with the transfer chamber 408, and in selective communication with the load lock chamber 404.

In some embodiments, the vacuum extension chamber 407 comprises a shelf (not shown) configured to store one or more substrates or substrate carriers 132 holding substrates 130. Processing chambers directly or indirectly connected to the transfer chamber 408 may store their substrates or substrate carriers 132 holding substrates 130 on the shelf and use the central robot 409 to transfer them.

The vacuum multi-chamber substrate processing tool 400 can further comprise a second transfer chamber assembly 430 connected to the first transfer chamber assembly 410 by the pass through chamber 431. In some embodiments, the pass through chamber 431, similar to a load lock chamber, is configured to provide an interface between two processing environments. In such embodiments, the pass through chamber 431 provides a vacuum interface between the first transfer chamber assembly 410 and the second transfer chamber assembly 430.

In some embodiments, the second transfer chamber assembly 430 is divided into two parts to minimize the footprint of the vacuum multi-chamber substrate processing tool 400. In some embodiments of the present disclosure, the second transfer chamber assembly 430 comprises a transfer chamber 433 and a vacuum extension chamber 432 in fluid communication with one another. An inner volume of the second transfer chamber assembly 430 is typically maintained at low pressure or vacuum condition during processing. The pass through chamber 431 may be connected to the transfer chamber 408 and the vacuum extension chamber 432 via slit valves 417 and 438 respectively so that the pressure within the transfer chamber 408 may be maintained at different vacuum levels.

In some embodiments, the transfer chamber 433 may be a polygonal structure having a plurality of sidewalls, a bottom and a lid. The plurality of sidewalls may have openings formed therein and are configured to connect with processing chambers, vacuum extension and/or pass through chambers. The transfer chamber 433 shown in FIG. 4 has a square or rectangular shape and is coupled with processing chambers 435, 436, 437, and the vacuum extension chamber 432. The transfer chamber 433 may be in selective communication with the processing chambers 435, 436, via slit valves 441, 440, 439 respectively.

A central robot 434 is mounted in the transfer chamber 433 at a robot port formed on the bottom of the transfer chamber 433. The central robot 434 is disposed in an internal volume 449 of the transfer chamber 433 and is configured to shuttle substrates, or substrate carriers 132 holding substrates 130, among the processing chambers 435, 436, 437, and the pass through chamber 431. In some embodiments, the central robot 434 may include two blades for holding substrates, or holding substrate carriers 132 holding substrates 130, each blade mounted on an independently controllable robot arm mounted on the same robot base. In another embodiment, the central robot 434 may have the capacity for moving the blades vertically.

In some embodiments, the vacuum extension chamber 432 is configured to provide an interface between a vacuum system and the second transfer chamber assembly 430. In some embodiments, the vacuum extension chamber 432 comprises a bottom, a lid and sidewalls. A pressure modification port may be formed on the bottom of the vacuum extension chamber 432 and is configured to adapt to a vacuum system. Openings are formed through the sidewalls so that the vacuum extension chamber 432 is in fluid communication with the transfer chamber 433, and in selective communication with the pass through chamber 431.

In some embodiments of the present disclosure, the vacuum extension chamber 432 includes a shelf (not shown), similar to that described in connection with the vacuum extension chamber 407 above. Processing chambers directly or indirectly connected to the transfer chamber 433 may store substrates or substrate carriers 132 holding substrates 130 on the shelf.

Typically, substrates are processed in a sealed chamber having a pedestal for supporting a substrate disposed thereon. The pedestal may include a substrate support that has electrodes disposed therein to electrostatically hold the substrate, or hold the substrate carriers 132 holding substrates 130, against the substrate support during processing. For processes tolerant of higher chamber pressures, the pedestal may alternately include a substrate support having openings in communication with a vacuum source for securely holding a substrate against the substrate support during processing.

Processes that may be performed in any of the chambers 411, 413, 435, 436, or 437, include deposition, implant, and thermal treatment processes, among others. In some embodiments, a chamber such as any of the chambers 411, 413, 435, 436, or 437, is configured to perform a sputtering process on a substrate, or on multiple substrates simultaneously. In some embodiments, chamber 411 is a degas chamber. In some embodiments, the chamber 413 is a pre-metallization clean chamber. The pre-metallization clean chamber can use a sputtering clean process comprising an inert gas, such as argon. In some embodiments, the chamber 435 is a deposition chamber. The deposition chamber used with embodiments described here can be any known deposition chamber.

While the foregoing is directed to embodiments of the present disclosure, other and further embodiments may be devised without departing from the basic scope thereof.

The invention claimed is:

1. A bridging front opening unified pod (FOUP), comprising:
   a bottom floor, a first side wall, a second side wall, a ceiling and a back wall that forms an enclosure volume having a front opening;
   a plurality of first supports coupled to the first side wall and extending into the enclosure volume, and a corresponding plurality of second supports coupled to the second side wall and extending into the enclosure volume, wherein each corresponding pair of first and second supports form a storage slot this is configured to support a substrate carrier when disposed thereon;
   a base plate assembly coupled to the bottom floor including a plurality of lift pins is configured to support a substrate when disposed thereon; and
   a docking slot disposed proximate the base plate assembly and configured to support a substrate carrier when disposed thereon.

2. The bridging FOUP of claim 1, wherein the storage slot and the docking slot are configured to support a 300 mm substrate carrier, and wherein the substrate carrier is configured to hold a 200 mm substrate.

3. The bridging FOUP of claim 1, wherein the storage slot and the docking slot are configured to support a 450 mm substrate carrier, and wherein the substrate carrier is configured to hold a 200 mm or 300 mm substrate.

4. The bridging FOUP of claim 1, wherein the storage slot and the docking slot are configured to support at least one of a 200 mm, 300 mm or 450 mm substrate.

5. The bridging FOUP of claim 1, wherein the bridging FOUP includes 15 storage slots configured to support 15 substrate carriers when disposed thereon.

6. The bridging FOUP of claim 5, wherein the storage slots are equidistantly spaced from each other.

7. The bridging FOUP of claim 5, wherein a vertical distance between the storage slots is about 12 mm to about 15 mm.

8. The bridging FOUP of claim 1, wherein the docking slot includes a first docking support coupled to the first side wall and extending into the enclosure volume, and a second docking support coupled to the second side wall and extending into the enclosure volume.

9. The bridging FOUP of claim 8, wherein each of the plurality of first supports, the plurality of second supports, and the first and second docking supports includes a support ledge that supports the substrate carrier along a portion of an outer diameter of the substrate carrier when disposed thereon.

10. The bridging FOUP of claim 8, wherein each of the plurality of first supports, the plurality of second supports, and the first and second docking supports is fabricated from one of Aluminum, Aluminum alloys, steel, Polyether ether ketone, or composite materials.

11. The bridging FOUP of claim 8, wherein each of the plurality of first supports, the plurality of second supports, and the first and second docking supports are removable and can be individually replaced.

12. A bridging front opening unified pod (FOUP), comprising:

a bottom floor, a first side wall, a second side wall, a ceiling and a back wall that forms an enclosure volume having a front opening;

a plurality of storage slots configured to support a substrate carrier when disposed thereon;

a base plate assembly comprising:
  a base plate coupled to the bottom floor;
  a pair of L-brackets coupled to the base plate, wherein each L-bracket includes a first lift pin;
  a second lift pin coupled to the base plate, wherein a height of each of the first lift pins and the second lift pin is selected such that the substrate is supported in a horizontally level position when disposed thereon; and a docking slot disposed proximate the base plate assembly and configured to support a substrate carrier when disposed thereon.

13. The bridging FOUP of claim 12, wherein the first lift pins are shorter than the second lift pin.

14. The bridging FOUP of claim 12, wherein the first lift pins and the second lift pin are stationary lift pins.

15. The bridging FOUP of claim 12, wherein the first lift pins are removably coupled to the L-brackets.

16. The bridging FOUP of claim 12, wherein the first lift pins and the second lift pin form a 180 mm support circumference and are 120° apart from each other.

17. The bridging FOUP of claim 12, wherein the placement of the L-brackets, first lift pins, and the second lift pin is selected to allow a robot blade end effector to place substrates on the first and second lift pins, and substrate carriers on the docking slot with sufficient clearance.

18. The bridging FOUP of claim 12, wherein each of the first lift pins and the second lift pin includes a circular protrusion on a top portion such that each of the first lift pins and the second lift pin provides point contact support with a backside of a substrate when disposed thereon.

19. A bridging front opening unified pod (FOUP), comprising:
  a bottom floor, a first side wall, a second side wall, a ceiling and a back wall that forms an enclosure volume having a front opening;
  a plurality of first supports coupled to the first side wall and extending into the enclosure volume, and a corresponding plurality of second supports coupled to the second side wall and extending into the enclosure volume, wherein each corresponding pair of first and second supports form a storage slot this is configured to support a substrate carrier when disposed thereon;
  a base plate assembly comprising:
    a base plate coupled to the bottom floor;
    a pair of L-brackets coupled to the base plate, wherein each L-bracket includes a first lift pin;
    a second lift pin coupled to the base plate, wherein a height of each of the first lift pins and the second lift pin is selected such that the substrate is supported in a horizontally level position when disposed thereon; and
  a docking slot disposed proximate the base plate assembly and configured to support a substrate carrier when disposed thereon.

20. The bridging FOUP of claim 19, wherein the storage slot and the docking slot are configured to support a 300 mm substrate carrier that is configured to hold a 200 mm substrate, and wherein the first lift pins and the second lift pin is configured to support a 200 mm substrate.

* * * * *